(12) United States Patent
Weinmann et al.

(10) Patent No.: US 7,026,747 B2
(45) Date of Patent: Apr. 11, 2006

(54) FLEXURAL ACTUATOR AND AN ACTUATOR MEANS FITTED WITH SAME

(75) Inventors: Michael Weinmann, Plüderhausen (DE); Martin Maichl, Salach (DE); Gebhard Munz, Schorndorf (DE); Helmut Schlaak, Ober-Ramstadt (DE); Andreas Joseph Schmid, Michelau (DE)

(73) Assignees: Festo AG & Co., Esslingen (DE); Argillon GmbH, Rednitz (DE)

(*) Notice: Subject to any disclaimer, the term of this patent is extended or adjusted under 35 U.S.C. 154(b) by 141 days.

(21) Appl. No.: 10/783,100

(22) Filed: Feb. 20, 2004

(65) Prior Publication Data

US 2004/0201332 A1 Oct. 14, 2004

(30) Foreign Application Priority Data

Feb. 25, 2003 (EP) .................................. 03004043

(51) Int. Cl.
*H01L 41/04* (2006.01)
*H01L 41/08* (2006.01)

(52) U.S. Cl. .................. 310/331; 310/330; 310/332

(58) Field of Classification Search ........ 310/330–332; 367/160
See application file for complete search history.

(56) References Cited

U.S. PATENT DOCUMENTS 5,068,567 A 11/1991 Jones .......................... 310/332
5,156,370 A * 10/1992 Silcox et al. ............... 248/550

FOREIGN PATENT DOCUMENTS

DE 38 33 157 A1 4/1990
DE 199 57 953 A1 6/2001
GB 2 329 514 A 3/1999
WO WP 01/89004 A1 11/2001

OTHER PUBLICATIONS

European Search Report Aug. 6, 2003.

* cited by examiner

*Primary Examiner*—Darren Schuberg
*Assistant Examiner*—J. Aguirrechea
(74) *Attorney, Agent, or Firm*—Hoffman & Baron, LLP

(57) ABSTRACT

A flexural actuator is fitted with an actuator means, the flexural actuator being fitted at its functional section with a sensor means for determination of the longitudinal stretch. This sensor means is placed at a position, and/or is placed in the longitudinal direction symmetrically on either side of such position, at which there is a constant longitudinal stretch independent from the setting force when the functional section is thrusting against a resistance.

19 Claims, 2 Drawing Sheets

FLEXURAL ACTUATOR AND AN ACTUATOR MEANS FITTED WITH SAME

BACKGROUND OF THE INVENTION

The invention relates to a flexural actuator having an elongated shape, comprising an attachment section for fixation of the flexural actuator and a functional section extending away from the attachment section and, by activation of the flexural actuator, able to be deflected athwart the longitudinal axis thereof such functional section being provided with at least one sensor means suitable for detecting longitudinal stretch.

Furthermore the invention relates to an actuator means comprising a flexural actuator having an elongated shape, which is fixed at an attachment section thereof to a base of the actuator means and which possesses a functional section extending away from the attachment section, such functional section being adapted to be deflected by activation of the flexural actuator athwart the longitudinal axis thereof and to be thrust against a resistance arranged in the deflection path, and which is fitted with at least one sensor means responsive to longitudinal stretch.

THE PRIOR ART

Flexural actuators are generally so designed that they may be fixed at an attachment section and they possess a cantilever functional section, which by the application of an operating voltage may be flexed and accordingly may be deflected athwart the longitudinal direction. The most commonly employed representatives of such flexural actuators are piezoelectric flexural actuators, as are described in the patent publication WO 01/89004 A1. Frequently they are, as also indicated in the said patent publication WO 01/89004 A1 as components of actuator means, which are designed in the form of fluid control valves and in the case of which the functional section is able to be pivoted in order to selectively open or close a fluid duct.

In the said patent publication WO 01/89004 A1 there is the description of a flexural actuator and of an actuator means fitted therewith of the type initially mentioned, the flexural actuator being fitted at the functional section with at least one sensor means, which is in a position of detecting the longitudinal stretch of the functional section. Accordingly monitoring of and/or feedback of the operating behavior of the flexural actuator is to be rendered possible without recourse to an external sensor system. However, as regards the practical realization some substantial problems have occurred.

Piezo-ceramic flexural actuators are, owing to the piezo-ceramic properties, subject to hysteresis and drift effects. Owing to hysteresis during the application of the operating voltage different deflections of the flexural actuator may occur dependent on the preceding flexure history. Furthermore, more particularly, there are mechanical and thermal drift effects, which combine together in the course of time- and result in a change in flexure and deflection.

Furthermore different external forces, which act on the flexural actuator, also lead to different flexures. Thus, in order to close the fluid duct of a control valve, different intensities of control forces may be necessary in a manner dependent on the pressures obtaining, which with the same deflection result in different flexural deformations of the flexural actuator. This means that the sensor means provided in accordance with the said patent publication WO 01/89004 A1 can not readily provide a reproducible result, Attempts have been made to reduce the hysteresis effect in piezo-ceramic flexural actuators by the development of piezo-ceramics with a low hysteresis characteristic. This however led to a reduction in the performance of the piezo-ceramic.

SHORT SUMMARY OF THE INVENTION

One object of the invention is to find measures which render possible an exact detection of the operation behavior of a flexural actuator.

In order to achieve these and/or other objects appearing from the present specification, claims and drawings, in the present invention, in the case of a flexural actuator and an actuator means of the type initially mentioned, this object is achieved since the sensor means is placed at a position, and/or symmetrically on either side of such position, at which, when the functional section thrusts against a resistance there is a constant longitudinal stretch independent from the setting force.

Calculations have indicated that the functional section of a flexural actuator has a position, spaced from the attachment section in the longitudinal direction, at which the longitudinal stretch occurring is independent of the force with which the activated functional section is thrust against a resistance placed in the path of its deflection. As at the other positions there is admittedly an increasing longitudinal stretch at this particular position, when the functional section, without engaging a resistance, is deflected to a greater and greater extent by the respective activation. However, as soon as the functional section meets with a resistance, as for example a valve seat of a fluid duct, the longitudinal stretch will not change at the respective position any more, even if and internal setting force of the flexural actuator is further increased. The constant longitudinal stretch value is a specific value of the respective flexural actuator, which is not influenced by the operating history.

Calculations performed on different flexural actuators have shown that the distance of the position of constant longitudinal stretch from the attachment section is as a rule a third of the distance between the operative section and the attachment section cooperating with the resistance, if the above mentioned distance is large in relation to the length of the functional section.

Ideally the sensor means would be placed directly and exclusively at the position of constant longitudinal stretch. Since however it is extremely difficult to design suitably miniaturized sensor means, the sensor means is as a rule so arranged that it ^will be placed on either side of the position of constant longitudinal stretch symmetrically in the longitudinal direction of the flexural actuator, it being either being made continuous at the position of longitudinal stretch or being interrupted. It is then possible to provide for an integration or summation along the measured stretch lengths on either side of the position of constant longitudinal stretch, so that using the overall sum it is possible to determine the deflection of the flexural actuator independently of the setting force in question and so that furthermore there is the possibility of subtracting the two partial stretch integrals from each other to find the currently existing setting force. On the basis of the invention flexural actuators may be exactly positioned in a closed loop mode independently of external forces. Moreover, the deflection of the functional section and the external force may be measured.

There is a multitude of varied applications for the invention in many different sectors, in the case of which setting forces are to be exerted by means of a flexural actuator on any desired structure. One possible application is use in fluid control valves in order to be able to detect the switching position of a flexural actuator employed as an actuating member and/or directly as a valve member in a precise manner.

Further advantageous developments of the invention are defined in the claims.

Preferably the sensor means is placed on one of the two surfaces, orientated in the deflection direction, of the functional section of the flexural actuator.

In order to produce a multiple sensor signal and accordingly a higher degree of precision, a plurality of sensor means may be simultaneously present, which more particularly, as related to the thickness direction, are placed in different planes and are preferably located on two mutually opposite surfaces of the flexural actuator orientated in the deflection direction.

As already briefly stated the sensor means may extend without interruption and continuously over the position of constant longitudinal stretch. However, it is also possible to have a design, in which the sensor means is interrupted at the position of constant longitudinal stretch and is more particularly made up of two sensor means parts, which in the longitudinal direction of the flexural actuator may be arranged at distance from one another. The distance of the two flexural actuator parts from the position of constant longitudinal stretch is of equal size and moreover the effective lengths of the two sensor means parts are equal.

The sensor means are for example based on the capacitive measuring principle, although it may be based on an ohmic resistance principle of measurement. Preferably stretch gage strips are employed.

In the case of a flexural actuator of a predetermined length the location of the position of constant longitudinal stretch is naturally dependent on the position of the attachment section, that is to say on where and along what length the flexural actuator is stationarily held in place.

Since in many cases these conditions of use can not be known at the time of manufacture of the flexural actuator, the flexural actuator may be provided with a sensor means, which extends along a substantial length of the flexural actuator and which is able to be selectively deactivated along a substantial length along the flexural actuator for adaptation to the position (which is arrived at later) of constant longitudinal stretch in order to obtain the necessary symmetrical design in relation to the position of constant longitudinal stretch. For instance, the sensor means may be so severed using a laser or other severing device that the desired symmetry is produced in relation to the position of constant stretch.

An actuator means fitted with the flexural actuator may for example constitute a drive in order to set a component, for example a valve member, in different positions. The actuator means can however also be designed simply as a fluid control valve, more particularly for pneumatic applications. In any case it is an advantage for the actuator means to have evaluating means, by means of which the deflection and/or setting force of the functional section may be determined on the basis of the stretch found by the sensor means.

Further advantageous developments and convenient forms of the invention will be understood from the following detailed descriptive disclosure in conjunction with the accompanying drawings.

LIST OF THE SEVERAL VIEWS OF THE FIGURES

FIG. 1a diagrammatically shows a working example of an actuator means, in the form of a fluid control valve, having the flexural actuator in accordance with the invention.

FIG. 1b is a plan view of the flexural actuator looking in the direction of the arrow I in FIG. 1a.

Figure 1A:
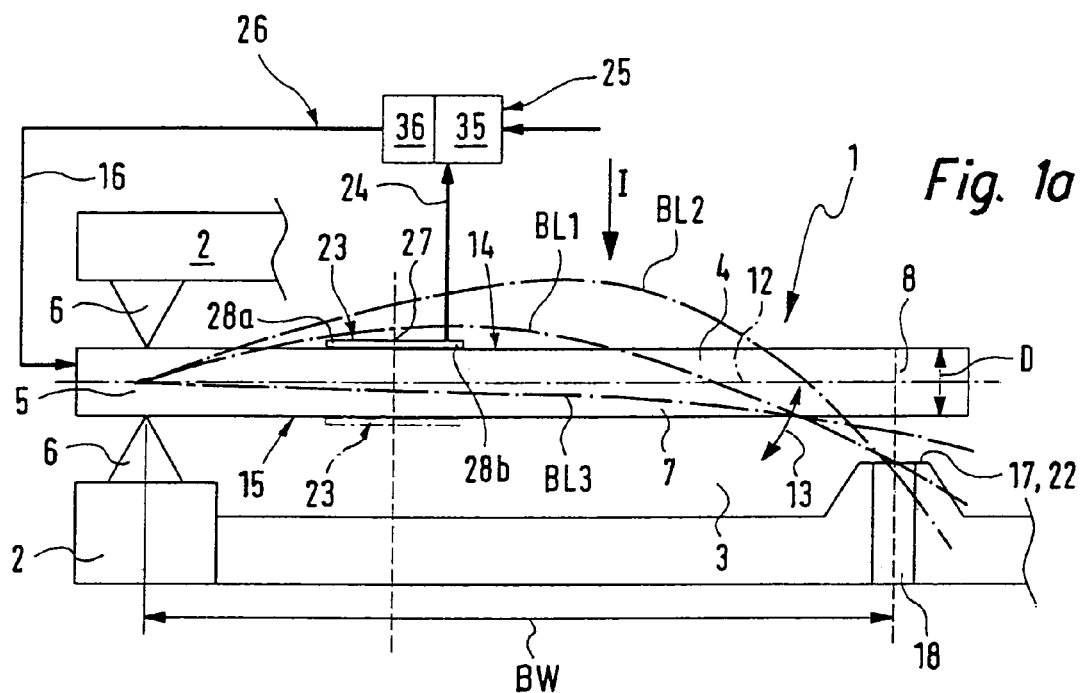
Figure 1B:
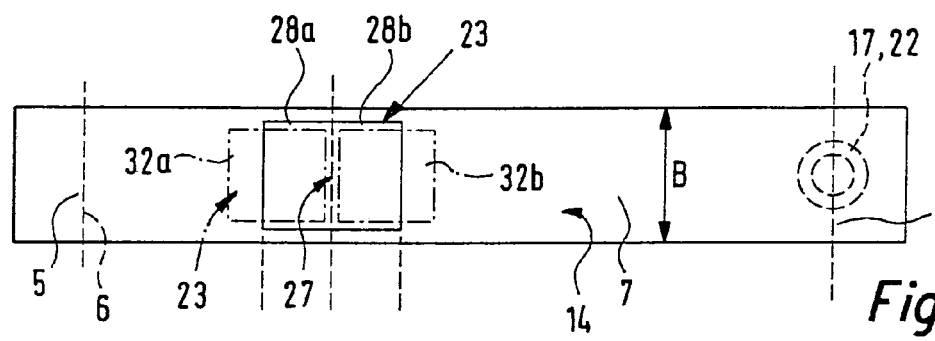

FIGS. 2a to 2e indicate the voltage dependent characteristic of the flexural actuator of FIGS. 1a and 1b with the longitudinal stretch e as a function of the effective flexural actuator length L, the integral along the measured stretch length of the sensor means being indicated by shading symmetrically in relation to the point of constant longitudinal stretch.

Figure 2A:
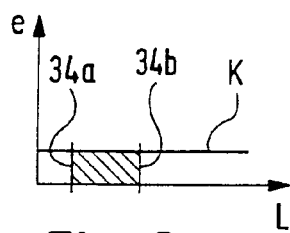
Figure 2B:
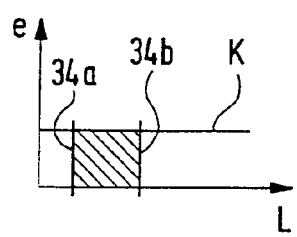
Figure 2C:
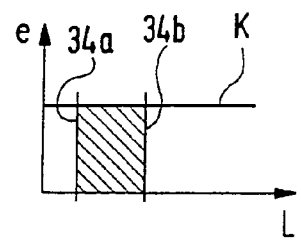
Figure 2D:
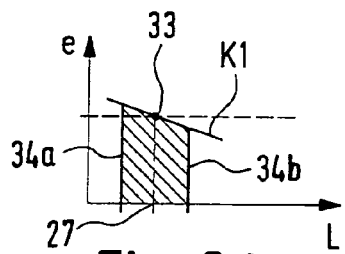
Figure 2E:
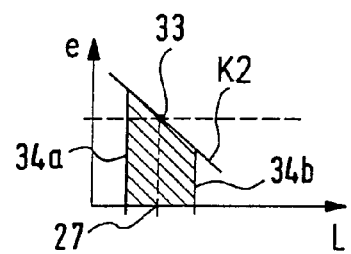
Figure 3:
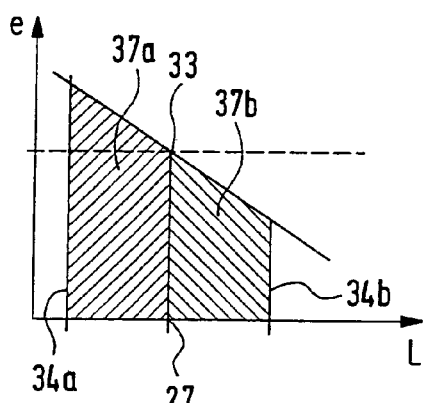

FIG. 3 shows the characteristic corresponding to FIG. 2e, the two part stretch integrals being shown shaded underneath the section lying to either side of the position of constant longitudinal stretch.

Figure 4:
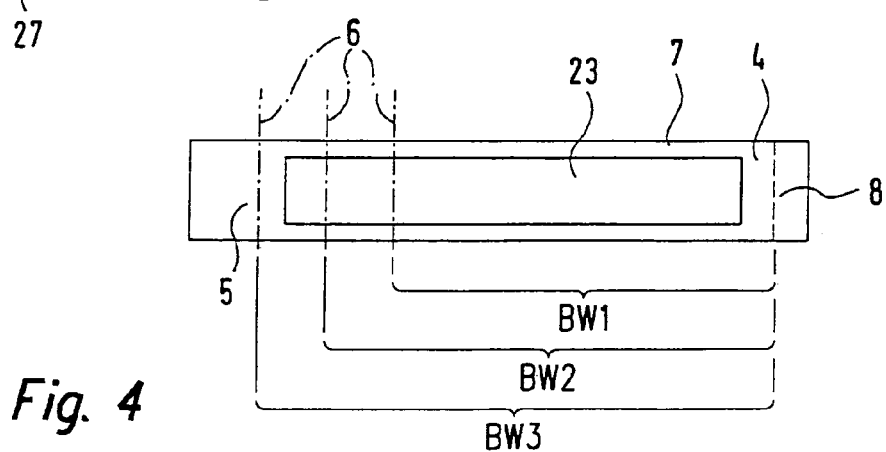

FIG. 4 separately shows a flexural actuator suitable for different possible designs of the sensor means in plan view like the view of FIG. 1b.

DETAILED ACCOUNT OF WORKING EMBODIMENT OF THE INVENTION

FIGS. 1a and 1b diagrammatically indicate an actuator means 1, which in the present case is in the form of a fluid control valve.

The actuator means 1 possesses a single- or multi-part base 2, which in the present case constitutes the valve housing and delimits a receiving chamber 3, in which a flexural actuator 4 with a elongated configuration is placed.

The flexural actuator 4 is of rail- or beam-like form. Its width B is as a rule larger than its thickness D.

One of the two axially orientated end portions of the flexural actuator 4 constitute an attachment section 5. This serves to stationarily mounted the flexural actuator 4 on the base 2.

The figure diagrammatically indicates how the attachment section 5 is firmly clamped in place so as to be between two support abutments 6 at the attachment section 5. The clamping action is generally such that the attachment section 5 is not able to be pivoted in relation to the abutments 6. The abutments 6 may be direct components of the base 2 or may be constituted for example by a cured cast synthetic resin embedded in the base 2.

A cantilever functional section of the flexural actuator 4 extends from the attachment section 5. Its end portion opposite to the attachment section 5 constitutes an operative section 8.

The flexural actuator 4 is a component, whose functional section 7, when suitably activated, is flexed and is deflected athwart the longitudinal axis 12 of the flexural actuator 4. The deflection movement is indicated by a double arrow at 13. The two longitudinal surfaces, with a greater area, of the flexural actuator 4, whose cross section is preferably rectangular, are orientated in the direction of the deflection movement 13 and in the working example, are, only to be more distinct, termed the top and bottom surfaces 14 and 15. FIG. 1b provides a view of the top surface 14.

The flexural actuator 4 can for example be a bimetallic or a memory metal flexural actuator. In the working embodiment illustrated it is a question of a piezoelectric flexural actuator, which is manufactured using commercially available piezoelectric ceramic material or some other suitable piezoelectric materials.

In the initial deactivated state the flexural actuator 4 assumes the stretched position indicated in full lines in FIG. 1a with a linear extent. By the application of an operating voltage by way of diagrammatically indicated leads 16 a deflection of the functional section 7 may be caused so that same is pivoted toward a valve seat 17 placed opposite the bottom surface 15, which seat lies in the deflection path of the functional section 7 and more precisely in the deflection path of the operative section 8.

The valve seat 17 delimits the opening of a fluid duct 18, more especially at least partially extending through the wall of the base 2, by way of which fluid duct 18 the fluid under a certain operating pressure may be supplied during operation of the fluid control valve, it being a question of a hydraulic fluid or of a gaseous fluid. Preferably it is a question of compressed air as the fluid.

The valve seat 17 constitutes a resistance 22 lying in the deflection path of the functional section 7, and the functional section 8 is thrust against it so that the fluid duct 18 is sealed off. It is in this manner that flow of the fluid into the receiving chamber 3 may be prevented.

In the deactivated condition of the flexural actuator 4 the operative section 8 is lifted clear of the valve seat 17 so that pressure medium may flow by way of fluid duct 18 into the receiving chamber 3 and thence be let off through a further fluid duct not illustrated in the drawing and also opening into the receiving chamber 3. Accordingly the actuator means may constitute a 2/2 or 3/2 way valve.

The flexural actuator is at the functional section 7 provided with a sensor means 23 which in the working example is fitted directly on the top surface 14. This sensor means is connected by way of a suitable electrical connection 24 with the diagrammatically indicated electronic evaluating means 25, which belong to an electronic control means, generally referenced 26, by way of which the drive of the flexural actuator with the desired operating voltage takes place. Using the sensor means 23 it is possible for the instantaneous deflection of the functional section 7 to be found, there being more particularly the possibility of detecting the end position resting against the resistance 22 in a manner independent of the setting force, with which the functional section 7 is thrust against the resistance 22.

The sensor means 23 is designed to find the longitudinal stretch of the functional section 7 in the portion fitted with the sensor means. The stretch found is a measure for the current deflection of the flexural actuator 4.

Considering the effective length BW of the flexural actuator measured between the attachment section 5 and the operative section 8, it will be seen that although the longitudinal stretch increases with the an increasing operating voltage and accordingly with a deflection, it is constant along the entire effective flexural actuator length BW as long as the attachment section 5 has not yet struck the resistance 22. In FIG. 2c as in FIG. 1c, the horizontal characteristic K indicates the condition practically directly prior to abutment on the resistance 22 or, respectively, the valve seat 17 constituting same.

In accordance with a previously performed calibration it is accordingly possible on the basis of the instantaneous longitudinal stretch as found by the sensor means 23 to ascertain the instantaneous degree of deflection of the functional section 7 and with it the relative position between the operative section 8 and the resistance 22 or, respectively, the valve seat 17.

A particular problem occurs however owing to the circumstance that the longitudinal stretch of the functional section 7 does not, as from the time of abutment on the resistance 22, constitute any constant along the effective flexural actuator length BW. The longitudinal stretch varies more particularly in a manner dependent on the setting force, with which the functional section 7 is biased, by the respective application of a voltage, toward or against the resistance 22. This setting force may vary during operation of the fluid control valve, more especially owing to fluctuations in the pressure acting by way of fluid duct 18 on the operative section 8. According to the respective loading there will be differently curved lines of flexure of the flexural actuator 4 dependent on the setting force, two such possible flexure lines being indicated at BL1 and BL2 in FIG. 1a. The flexure line BL3 also indicated diagrammatically represents a geometry of the flexural actuator 4 in the deflected condition but not yet in contact with the resistance 22.

However, as surprisingly found by calculations, the flexural actuator 4 has a predetermined, particular position at which the longitudinal stretch remains constant independently of the setting force with which the functional section 7 is thrust against the resistance 22. This position, termed the position 27 of constant longitudinal stretch, lies, as considered in the direction of the longitudinal axis 12, between the attachment section 5 and the operative section 8, it being spaced from both. In the working example the effective length BW of the flexural actuator is divided with a ratio of 1/3:2/3 by the position 27 of constant longitudinal stretch, the shorter distance being that of the attachment section 5. Further measurements have indicated that this particular distance relationship as a rule always applies when the clamped length of the flexural actuator 4 adjacent to attachment section 5 is small in relation to the effective flexural actuator length BW.

The position 27 of constant longitudinal stretch may for example be calculated by finite element methods.

The above described discovery is in accordance with the invention employed for the placement of the sensor means 23 on the flexural actuator 4. Accordingly the sensor means 23 is seated at the position 27 of constant longitudinal stretch and/or symmetrically to either side of such position in the longitudinal direction.

Ideally the sensor means 23 would be concentrated at the position 27 of constant longitudinal stretch. Since this position is however punctuate or linear and is therefore extremely narrow in the direction of the longitudinal axis 12, very small and expensive sensor structures would be required. Therefore it is convenient to utilize a shape in which the sensor means 23 extends over the position 27 of constant longitudinal stretch so that it has middle section lies directly at this position 27 of constant longitudinal stretch and additionally and has two sensor sections 28a and 28b, of equal length, aligned with the longitudinal axis 12 and lying on either side of the position 27 of constant longitudinal stretch in a symmetrical fashion. During stretch measurement the measured stretched parts on either side of the position 27 of constant longitudinal stretch neutralize each other so that finally the longitudinal stretch currently obtaining at the relevant position 27 is able to be found.

The sensor means 23 may be of any suitable type which renders it possible to find the longitudinal stretch of the functional section 7 at the position having the sensor means 23. As a rule it will be a question of a sensor means 23, which is based on the capacitive or ohmic principle of measurement. It is an advantage more particularly to utilize a strip stretch gage.

While consequently in the case of the working example the sensor means 23 extends continuously over the position of constant longitudinal stretch, a design indicated in chained lines in FIG. 1b is possible, in the case of which the sensor means 23 has an interruption at the position 27 of constant longitudinal stretch. In this case it for example has two sensor means parts 23a and 23b placed symmetrically at the same distance on either side of the position 27 of constant longitudinal stretch, such parts 32a and 32b constituting the two sensor sections 28a and 28b.

A continuous sensor means would also be possible with a central tapping point like a voltage divider.

In FIG. 1a chained lines are employed to indicate that the sensor means 23 may also as an alternative or in addition be placed on the bottom surface 15 of the functional section 7. By the multiple arrangement in a plurality of planes spaced apart in the thickness direction D it is possible to have a multiple sensor signal enhancing precision.

Instead of mounting the sensor means 23 on the surface of the functional section 7—attachment may for example be by way of bonding—a complete or partial integration of one or more sensor means 23 in the material of the flexural actuator 4 and/or, in the case of a laminated design thereof, between the individual flexural actuator layers would be possible. However care must be taken to see that the one or more sensor means are placed at a distance from the neutral fiber of the flexural actuator 4, at which the there is no elongation. The placement on the outer surface 14 and 15 of the flexural actuator 4 offers the advantage that in this case the distance from the neutral fiber is relatively large and accordingly more exact measurements may be expected.

Figure 1C:
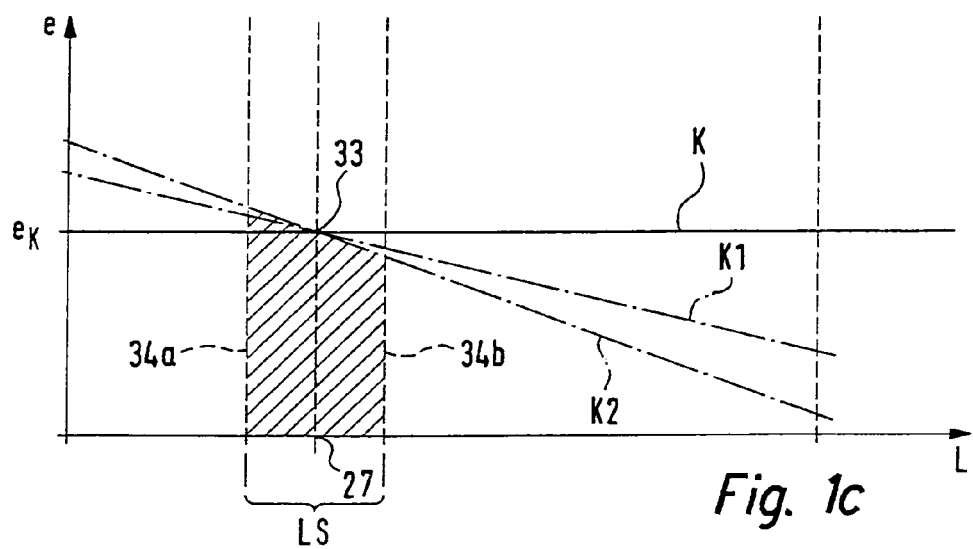
FIG. 1c is a diagram indicating the changes in longitudinal stretch e along the effective length L.

Reverting to the diagram of FIG. 1c it will be seen the flexure lines BL1 and BL2 are indicated in chained lines as characteristics, in the case of which it is a question of straight lines at different slopes which however meet the horizontal characteristic K at a common point, such common point 33 reproducing or corresponding the longitudinal stretch $e_K$ at the position 27 of constant longitudinal stretch. At the same distance on either side of this position 27 there are vertical lines forming limiting lines 34a and 34b, by which the axially orientated ends of the sensor means 23 are marked. The length section LS lying between the limiting lines 34a and 34b corresponds to the length of the sensor means 23 between the mutually opposite outer ends.

In the case of a typical case of application of the actuator means 1 and of the flexural actuator 4 contained therein firstly, in the course of calculations or tests, the value of the constant longitudinal stretch $e_K$ is found. Finding it is preferably performed by calculation of the integral underneath the characteristics K1 and/or K2 and/or another of these characteristics occurring during flexure, that is to say along the length of the sensor means LS. In FIG. 1c, by way of example, the integral formed underneath the characteristic K1 is indicated by shading.

On activation of the flexural actuator 4 using the evaluation means 25, which have suitable integrating means 35, the integral underneath the current characteristic between the two limit lines 34a and 34b is found. In accordance with FIGS. 2a through 2c there is an increase in this integral with an increasing actuation voltage and corresponding deflection of the functional section 7. The values found are then compared by the comparison means 36, also belonging to the evaluating means 25, with the desired value, found by the previous calibration, of the integral, which value corresponds to the that deflection, at which the functional section 7 is thrust with a larger or smaller force against the resistance 22 or, respectively, the valve seat 17.

If for example it is intended to deflect the functional section 7 so far that the operative section 8 abuts the valve seat 17 closing the fluid duct 18, the operating voltage, supplied by way of the leads, is increased until the integral found is equal to the desired value. In this respect it is an advantage that the integral found is dependent on the level of the setting force. It will be seen from FIGS. 2d and 2e that as from the instant of application of the functional section 7 to the resistance 22 any variation of the operating voltage and consequently of the setting force will be accompanied by a change in the slope of the characteristic without the location of the point 33 being changed so that the integral found remains constant.

Accordingly the deflected position of the functional section 7 may be found independently of the force. In the case of a particular deflection of the functional section 7 the longitudinal stretch found is independent of the force obtaining. Accordingly it is hence possible to determine with a high degree of precision, independently of the setting force applied, when the flexural actuator 4 has reached the desired deflection.

For integration the circumstance is made use of that on either side of the position 27 of constant longitudinal stretch areas of linear longitudinal stretch are present and accordingly exact summation is possible.

In the working embodiment there is furthermore the possibility, by having a suitable design of the sensor means 23, of separately determining the position of the partial stretch integrals 37a and 37b, lying on either side of the position 27 of constant longitudinal stretch. This is particularly simple in the case of a sensor means 23, which is composed of a plurality of separate sensor means parts 32a and 32b. There is the possibility, by addition of the two partial stretch integrals 37a and 37b of performing the above mentioned force independent determination of the deflection of the flexural actuator 4. Moreover there is however also the possibility of subtracting the two partial stretch integrals 37a and 37b from each other, the result being a measure for the setting force, with which the flexural actuator 4 currently presses against the resistance 22.

By using the suitably designed evaluating means 25 to both add and also subtract the two partial stretch integrals 37a and 37b from each other, the flexural actuator 4 may be readily so controlled that it engages the resistance 22 with a predetermined force on reaching the corresponding degree of deflection.

All in all there is accordingly the possibility of using stretch integration along the full length LS of the sensor means 26 to find the deflection of the flexural actuator 4 independently of the external force. Furthermore by subtraction of the partial stretch integrals the external force may be found. It is in this manner that a plurality of new applications may be opened up for flexural actuators and more especially those having a piezoelectric ceramic structure.

A further advantageous aspect is provided, if the flexural actuator 4 is provided with a sensor means 26, which extends along a fair distance, as is indicated in FIG. 4. In the case of such a design one and the same flexural actuator 4 may be configured for different cases of application, which differ as regards the position of the abutments 6 on the attachment section so that the effective length of the flexural actuator can be different, as is illustrated in FIG. 4 by the three possible flexural actuator lengths BW1, BW2 and BW3.

Since the location of the position 27 of constant longitudinal stretch is orientated in accordance with the effective flexural actuator length BW, in the case of the applications indicated there are different locations for the position 27 of constant longitudinal stretch. The sensor means 23 is however so designed that it may be selectively deactivated in its longitudinal direction by, for example, using a laser or other severing tool, to trim off length sections, which are not required, from the remaining part. Accordingly it is possible for the sensor means 23 to be so tailored in a manner dependent on the respectively applying position 27 of constant longitudinal stretch that the desired symmetry is produced between the sections, located on either side of the position 27 of constant longitudinal stretch, of the sensor means 23.

The invention claimed is:

1. A flexural actuator having an elongated shape, comprising an attachment section for fixation of the flexural actuator and a functional section, extending away from the attachment section, able to be deflected athwart the longitudinal axis thereof by activation of the flexural actuator, such functional section being provided with at least one sensor means suitable for detecting longitudinal stretch, wherein the sensor means is placed at a position, at which, when the functional section thrusts against a resistance there is a constant longitudinal stretch independent of the setting force.

2. The flexural actuator as set forth in claim 1, wherein the sensor means is placed on a surface of said functional section orientated in the direction of the deflection movement.

3. The flexural actuator as set forth in claim 2, comprising a plurality of such sensor means, which are placed in different planes on the flexural actuator.

4. The flexural actuator as set forth in claim 3, wherein on each of the two surfaces, orientated in the direction of the deflection movement, of the functional section in each case at least one sensor means is placed.

5. The flexural actuator as set forth in claim 1, wherein the sensor means extends continuously over the position of constant longitudinal stretch.

6. The flexural actuator as set forth in claim 1, wherein the sensor means is interrupted at the position of constant longitudinal stretch.

7. The flexural actuator as set forth in claim 1, wherein the sensor means is adapted for capacitive measurement.

8. The flexural actuator as set forth in claim 1, wherein the sensor means is adapted for ohmic measurement.

9. The flexural actuator as set forth in claim 1, wherein the sensor means is strip-like in its configuration.

10. The flexural actuator as set forth in claim 1, wherein such sensor means extends along a substantial length along the flexural actuator and for customization resulting from a particular application the position of constant longitudinal stretch may be selectively deactivated.

11. The flexural actuator as set forth in claim 1, designed in the form of a piezoelectric flexural actuator.

12. The actuator means as set forth in claim 1, comprising evaluating means responsive to at least one of the deflection and the setting force of the functional section on the basis of the longitudinal stretch found using the sensor means.

13. The actuator means as set forth in claim 12, comprising evaluating means for finding at least one of the deflection and the setting force of the functional section on the basis of the longitudinal stretch measured with the sensor means and furthermore comparator means for comparison of the stretch integral round with a predetermined desired value.

14. The actuator means as set forth in claim 12, wherein the evaluating means are designed to separately measure the stretch integrals of the sections, which lie underneath on either side of the position of constant stretch, and to add together or subtract the stretch integrals to and, respectively, from each other.

15. The flexural actuator as set forth in claim 1, wherein said sensor means is placed symmetrically on either side of said position.

16. An actuator means, comprising a flexural actuator which is fixed in place by means of an attachment section on a base, and which comprises a functional section extending away from the attachment section, which functional section is able to be deflected by activation of the flexural actuator athwart the longitudinal axis thereof and may be thrust against a resistance arranged in the deflection path and which is provided with at least one sensor means responsive to the longitudinal stretch, wherein the sensor means is placed at a position, at which with the functional section thrust against the resistance, there is a constant longitudinal stretch independent of the setting force.

17. The actuator means as set forth in claim 16, wherein the resistance is constituted by a valve seat provided for a fluid duct.

18. The actuator means as set forth in claim 12 in the form of a fluid control valve.

19. The actuator means as set forth in claim 16, wherein the sensor means is placed on a surface of said functional section oriented in the direction of the deflection movement.

* * * * *